(12) United States Patent
Yamaguchi

(10) Patent No.: US 12,104,113 B2
(45) Date of Patent: Oct. 1, 2024

(54) THERMALLY CONDUCTIVE SILICONE COMPOSITION, PRODUCTION METHOD THEREOF, AND SEMICONDUCTOR DEVICE

(71) Applicant: SHIN-ETSU CHEMICAL CO., LTD., Tokyo (JP)

(72) Inventor: Takahiro Yamaguchi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 427 days.

(21) Appl. No.: 17/762,844

(22) PCT Filed: Sep. 7, 2020

(86) PCT No.: PCT/JP2020/033738
§ 371 (c)(1),
(2) Date: Mar. 23, 2022

(87) PCT Pub. No.: WO2021/059936
PCT Pub. Date: Apr. 1, 2021

(65) Prior Publication Data
US 2022/0275265 A1    Sep. 1, 2022

(30) Foreign Application Priority Data

Sep. 27, 2019   (JP) .................................. 2019-177423

(51) Int. Cl.
C09K 5/08      (2006.01)
H01L 23/373    (2006.01)

(52) U.S. Cl.
CPC ............ C09K 5/08 (2013.01); H01L 23/3737 (2013.01)

(58) Field of Classification Search
CPC .............................. H01L 23/3737; C09K 5/08
See application file for complete search history.

(56) References Cited

U.S. PATENT DOCUMENTS

| | | |
|---|---|---|
| 2003/0049466 A1 | 3/2003 | Yamada et al. |
| 2007/0149834 A1 | 6/2007 | Endo et al. |
| 2008/0254247 A1 | 10/2008 | Asaine |
| 2011/0024675 A1 | 2/2011 | Endo et al. |
| 2011/0188213 A1 | 8/2011 | Domae et al. |
| 2012/0085964 A1 | 4/2012 | Matsumoto et al. |
| 2012/0119137 A1 | 5/2012 | Tsuji et al. |
| 2014/0094554 A1 | 4/2014 | Matsumoto et al. |
| 2015/0183951 A1 | 7/2015 | Bhagwagar et al. |
| 2019/0292349 A1 | 9/2019 | Ito |

FOREIGN PATENT DOCUMENTS

| | | |
|---|---|---|
| EP | 0 939 115 A1 | 9/1999 |
| JP | 7-228779 A | 8/1995 |
| JP | 2938428 B1 | 8/1999 |
| JP | 2938429 B1 | 8/1999 |
| JP | 2004-91743 A | 3/2004 |
| JP | 3580366 B2 | 10/2004 |
| JP | 3952184 B2 | 8/2007 |
| JP | 2008-260798 A | 10/2008 |
| JP | 2009-209165 A | 9/2009 |
| JP | 2009-286855 A | 12/2009 |
| JP | 4572243 B2 | 11/2010 |
| JP | 4656340 B2 | 3/2011 |
| JP | 2012-69783 A | 4/2012 |
| JP | 2012-77256 A | 4/2012 |
| JP | 4913874 B2 | 4/2012 |
| JP | 4917380 B2 | 4/2012 |
| JP | 2012-96361 A | 5/2012 |
| JP | 2012-102283 A | 5/2012 |
| JP | 4933094 B2 | 5/2012 |
| JP | 2013-91683 A | 5/2013 |
| JP | 2015-623456 A | 8/2015 |
| JP | 2017-210518 A | 11/2017 |
| JP | 2017-226724 A | 12/2017 |
| WO | WO 2013/018416 A1 | 2/2013 |

OTHER PUBLICATIONS

International Search Report, issued in PCT/JP2020/033738, dated Nov. 17, 2020.
Written Opinion of the International Searching Authority, issued in PCT/JP2020/033738, dated Nov. 17, 2020.

*Primary Examiner* — Victor A Mandala
*Assistant Examiner* — Colleen E Snow
(74) *Attorney, Agent, or Firm* — Birch, Stewart, Kolasch & Birch, LLP

(57) ABSTRACT

This thermally conductive silicone composition contains:
(A) 100 parts by mass of a diorganopolysiloxane in which both terminals of a molecular chain are blocked with hydroxy groups;
(B) 150-600 parts by mass of an organopolysiloxane with a particular structure having at least one hydrolyzable silyl group in one molecule;
(C) 0.1-100 parts by mass of a crosslinking agent component;
(D) 1,500-6,500 parts by mass of zinc oxide particles which have an average particle diameter of 0.1 μm to 2 μm, and in which the content ratio of a coarse powder having a particle diameter of 10 μm or more in a laser diffraction-type particle size distribution is 1 vol % or less with respect to the total amount of component (D); and
(E) 0.01-30 parts by mass of an adhesion promoter, wherein the content of component (D) is 45-70 vol % with respect to the total composition.
This thermally conductive silicone composition has a higher thermal conductivity than the prior art, can be compressed to a thickness of 10 μm or less, and also has high durability.

12 Claims, 1 Drawing Sheet

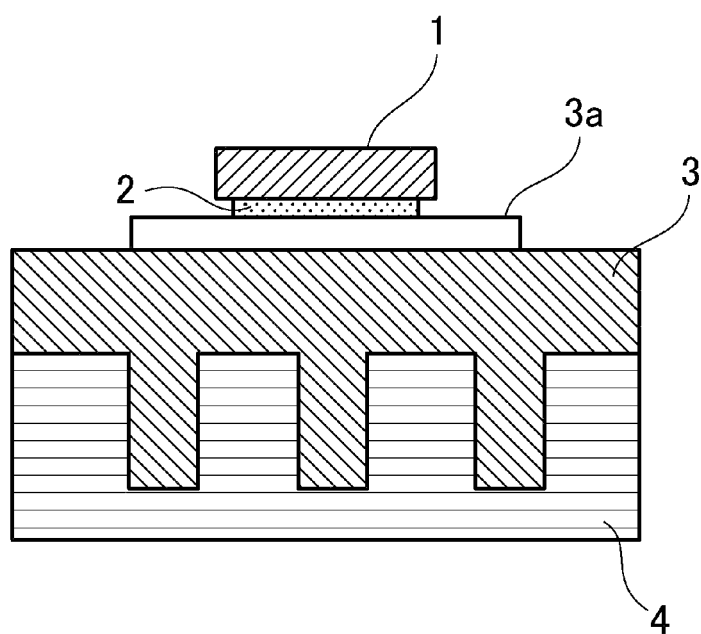

THERMALLY CONDUCTIVE SILICONE COMPOSITION, PRODUCTION METHOD THEREOF, AND SEMICONDUCTOR DEVICE

TECHNICAL FIELD

This invention relates to a heat-conductive silicone composition. More specifically, the invention relates to a heat-conductive silicone composition that efficiently cools electronic components, to a method for producing the same, and to a semiconductor device.

BACKGROUND ART

It is widely known that electronic components generate heat during use and undergo a resulting decline in performance. Various heat-dissipating techniques are used as means for resolving this problem. Generally, heat dissipation is carried out by placing a cooling member (a heat sink or the like) near the heat-generating member and, with both set in close contact, efficiently removing heat from the cooling member. At this time, if there is a gap between the heat-generating member and the cooling member, the heat resistance increases due to the presence therebetween of air, which has a poor ability to conduct heat, and so the temperature of the heat-generating member fails to decline to a sufficient degree. In order to prevent this from happening, use is made of a heat-dissipating material that has a good thermal conductivity and the ability to conform to the surfaces of the members, such as a liquid heat-dissipating material or a heat-dissipating sheet. In particular, there are cases where, depending on the device, the gap is 10 μm or less, which is very small; in such cases, a liquid heat-dissipating material that can be compressed to 10 μm or less is used (JP No. 2938428, JP No. 2938429, JP No. 3580366, JP No. 3952184, JP No. 4572243, JP No. 4656340, JP No. 4913874, JP No. 4917380, JP No. 4933094, JP-A 2008-260798, JP-A 2009-209165, JP-A 2012-102283, JP-A 2012-96361 (Patent Documents 1 to 13)).

Also, it is often necessary to ensure an electrically insulating state between the heat-generating member and the cooling member, and so the heat-conductive material is sometimes required to have electrically insulating properties. In such cases, metallic particles of aluminum, copper silver and the like cannot be used as the heat-conductive filler; instead, an electrically insulating heat-conductive filler such as aluminum hydroxide or alumina (aluminum oxide) is often used. Because aluminum hydroxide and alumina themselves to have low thermal conductivities, when these are used, a high loading is required in order to obtain a heat-conductive material having a high heat conductivity. As a result, the heat-conductive material has a very high viscosity, which gives rise to problems, such as making the material difficult to apply or impossible to sufficiently compress, or increasing the heat transfer distance (JP-A 2017-226724, JP-A 2017-210518 (Patent Documents 14 and 15)).

In addition, it is known that because the heat-generating member and the cooling member repeatedly heat and cool, these members undergo repeated thermal shrinkage. This promotes the separation of oil components and heat-conductive fillers in the heat-conductive silicone composition. Also, the phenomenon of "pump-out" arises, which is the forcing out of the heat-conductive silicone composition from between the heat-generating member and the cooling member. As a result, the heat resistance rises, making it impossible to efficiently cool the heat-generating member. To prevent this from happening, a technique has been described that increases the viscosity of the heat-conductive silicone composition by adding a thickener. However, a problem with this approach is that the viscosity becomes too high, making the composition difficult to apply (JP-A 2004-91743 (Patent Document 16)).

PRIOR ART DOCUMENTS

Patent Documents

Patent Document 1: JP No. 2938428
Patent Document 2: JP No. 2938429
Patent Document 3: JP No. 3580366
Patent Document 4: JP No. 3952184
Patent Document 5: JP No. 4572243
Patent Document 6: JP No. 4656340
Patent Document 7: JP No. 4913874
Patent Document 8: JP No. 4917380
Patent Document 9: JP No. 4933094
Patent Document 10: JP-A 2008-260798
Patent Document 11: JP-A 2009-209165
Patent Document 12: JP-A 2012-102283
Patent Document 13: JP-A 2012-96361
Patent Document 14: JP-A 2017-226724
Patent Document 15: JP-A 2017-210518
Patent Document 16: JP-A 2004-91743

SUMMARY OF INVENTION

Technical Problem

As mentioned above, there exists a desire for the development of a heat-conductive silicone composition which has both a high thermal conductivity and is compressible to a thickness of 10 μm or below, and which also has a high durability (power cycling resistance, pump-out resistance).

It is therefore an object of the present invention to provide a heat-conductive silicone composition which, compared with conventional heat-conductive silicone compositions, has a high thermal conductivity and is compressible to a thickness of 10 μm or less, and which moreover has a high durability. A further object of the invention is to provide a method for producing such a composition, and a still further object is to provide a semiconductor device.

Solution to Problem

The inventor has conducted extensive investigations in order to achieve this object, discovering as a result that a silicone composition which includes a hydroxyl group-containing organopolysiloxane, an organopolysiloxane of a specific structure having at least one hydrolyzable silyl group per molecule, a hydrolyzable organosilane compound and/or a partial hydrolytic condensation product thereof having one unsubstituted monovalent hydrocarbon group selected from among alkyl groups of 1 to 4 carbon atoms, alkenyl groups of 2 to 4 carbon atoms and aryl groups of 6 to 8 carbon atoms and having also three hydrolyzable groups per molecule, and zinc oxide which has a mean particle diameter within a specific range and contains a specific proportion of coarse product with a particle diameter of 10 μm or more has a higher thermal conductivity than conventional silicone compositions, possesses a good compressibility to a thickness of 10 μm or less, and moreover enables a high durability (power cycling resistance, pump-out resistance) to be achieved. This discovery ultimately led to the present invention.

Accordingly, the invention provides the following heat-conductive silicone composition and method of production thereof, and also the following semiconductor device.

1.

A heat-conductive silicone composition which includes:
(A) 100 parts by weight of an organopolysiloxane of general formula (1) below

[Chem. 1]

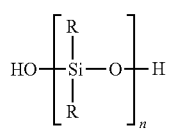

(wherein each R is a substituted or unsubstituted monovalent hydrocarbon group of 1 to 20 carbon atoms, multiple occurrences of R may be the same or may be different, and n is an integer of 10 or more);
(B) from 150 to 600 parts by weight of an organopolysiloxane of general formula (2) below having at least one hydrolyzable silyl group per molecule

[Chem. 2]

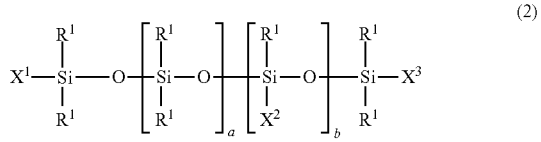

(wherein each $R^1$ is independently a substituted or unsubstituted monovalent hydrocarbon group, $X^1$ and $X^3$ are each independently a group represented by $R^1$ or $-R^2-SiR^3_g(OR^4)_{3-g}$, and $X^2$ is a group represented by $-R^2-SiR^3_g(OR^4)_{3-g}$, there being at least one $-R^2-SiR^3_g(OR^4)_{3-g}$ moiety on the molecule; $R^2$ is an oxygen atom or an alkylene group of 1 to 4 carbon atoms, each $R^3$ is independently a substituted or unsubstituted monovalent hydrocarbon group which does not contain an aliphatic unsaturated bond, each $R^4$ is independently an alkyl group of 1 to 4 carbon atoms or an alkoxyalkyl, alkenyl or acyl group of 2 to 4 carbon atoms, and g is an integer from 0 to 2; the subscripts a and b respectively satisfy the conditions $1 \leq a \leq 1,000$ and $0 \leq b \leq 1,000$, with the proviso that if $X^1$ and $X^3$ are both $R^1$, b satisfies the condition $1 \leq b \leq 1,000$; and recurring units may each be randomly bonded);
(C) from 0.1 to 100 parts by weight of a crosslinking agent which is a hydrolyzable organosilane compound having one unsubstituted monovalent hydrocarbon group selected from the group consisting of alkyl groups of 1 to 4 carbon atoms, alkenyl groups of 2 to 4 carbon atoms and aryl groups of 6 to 8 carbon atoms and three hydrolyzable groups per molecule and/or a partial hydrolytic condensation product thereof;
(D) from 1,500 to 6,500 parts by weight of zinc oxide particles which have a mean particle diameter of at least 0.1 μm but not more than 2 μm and contain a proportion of coarse product having a particle diameter of 10 μm or more in laser diffraction particle size distribution that is not more than 1 vol % of component (D) overall; and
(E) from 0.01 to 30 parts by weight of an adhesion promoter exclusive of component (C),
wherein the composition has a content of component (D) that is from 45 to 70 vol % of the overall composition and a thermal conductivity at 25° C. as determined by the hot disk method of at least 1.3 W/mK, and is compressible to a thickness of 10 μm or less.

2.

The heat-conductive silicone composition of 1 above, wherein the content of component (B) is from 20 to 40 vol % with respect to the overall composition.

3.

The heat-conductive silicone composition of 1 or 2 above, further including (F) from 0.01 to 20 parts by weight of a reaction catalyst per 100 parts by weight of component (A).

4.

The heat-conductive silicone composition of any of 1 to 3 above, further including (G) from 1 to 1,000 parts by weight of a filler other than component (D) per 100 parts by weight of component (A).

5.

The heat-conductive silicone composition of any of 1 to 4 above which has a heat resistance at 25° C., as measured by the laser flash method, of 5 mm²·K/W or less.

6.

The heat-conductive silicone composition of any of 1 to 5 above which has an absolute viscosity at 25° C. and a shear rate of 6 s⁻¹, as measured with a spiral viscometer, of from 3 to 600 Pa·s.

7.

The heat-conductive silicone composition of any of 1 to 6 above which can suppress creep following a heat cycling test.

8.

The heat-conductive silicone composition of any of 1 to 7 above, wherein component (D) is surface-treated with component (B).

9.

A method for producing the heat-conductive silicone composition of any of 1 to 8 above, which method includes the step of mixing together components (A), (B), (C), (D) and (E).

10.

A method for producing the heat-conductive silicone composition of any of 1 to 8 above, which method includes the steps of mixing component (B), or components (A) and (B), together with component (D) for at least 30 minutes at a temperature of 100° C. or more, and then mixing therein at least components (C) and (E).

11.

A semiconductor device having a heat-generating body and a cooling body between which is formed a gap not thicker than 10 μm, and a layer of the heat-conductive silicone composition of any of 1 to 8 above that fills the gap, which composition layer is thermally interposed between the heat-generating body and the cooling body.

12.

The semiconductor device of 11 above, wherein the heat-generating body is an insulated gate bipolar transistor.

Advantageous Effects of Invention

This invention is able to provide heat-conductive silicone compositions which have a higher thermal conductivity than conventional heat-conductive silicone compositions, which have a good compressibility to a thickness of 10 μm or less, and which also possess a high durability (power cycling resistance, pump-out resistance).

In this invention, "compressibility to a thickness of 10 μm or less" means that when the heat-conductive silicone composition is placed to a given thickness between two substrates and these are pressurized and compressed under a given pressure, the heat-conductive silicone composition filled between the two substrates has a minimum thickness of 10 μm or less.

BRIEF DESCRIPTION OF DRAWINGS

FIG. 1 is a cross-sectional diagram showing an example of a semiconductor device in which the heat-conductive silicone composition of the invention is interposed between an insulated gate bipolar transistor and a cooling fin.

DESCRIPTION OF EMBODIMENTS

As mentioned above, there has existed a desire for the development of silicone compositions which have a high thermal conductivity and good compressibility to 10 μm or less.

Accordingly, the invention relates to a heat-conductive silicone composition which includes:
(A) 100 parts by weight of an organopolysiloxane of general formula (1) below

[Chem. 3]

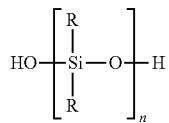

(1)

(wherein each R is a substituted or unsubstituted monovalent hydrocarbon group of 1 to 20 carbon atoms, multiple occurrences of R may be the same or may be different, and n is an integer of 10 or more);
(B) from 150 to 600 parts by weight of an organopolysiloxane of general formula (2) below having at least one hydrolyzable silyl group per molecule

[Chem. 4]

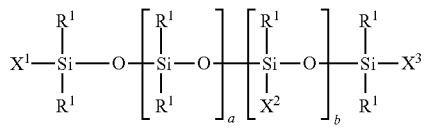

(2)

(wherein each $R^1$ is independently a substituted or unsubstituted monovalent hydrocarbon group, $X^1$ and $X^3$ are each independently a group represented by $R^1$ or $-R^2-SiR^3_g(OR^4)_{3-g}$, and $X^2$ is a group represented by $-R^2-SiR^3_g(OR^4)_{3-g}$, there being at least one $-R^2-SiR^3_g(OR^4)_{3-g}$ moiety on the molecule; $R^2$ is an oxygen atom or an alkylene group of 1 to 4 carbon atoms, each $R^3$ is independently a substituted or unsubstituted monovalent hydrocarbon group which does not contain an aliphatic unsaturated bond, each $R^4$ is independently an alkyl group of 1 to 4 carbon atoms or an alkoxyalkyl, alkenyl or acyl group of 2 to 4 carbon atoms, and g is an integer from 0 to 2; the subscripts a and b respectively satisfy the conditions 1≤a≤1,000 and 0≤b≤1,000, with the proviso that if $X^1$ and $X^3$ are both $R^1$, b satisfies the condition 1≤b≤1,000; and recurring units may each be randomly bonded);
(C) from 0.1 to 100 parts by weight of a crosslinking agent which is a hydrolyzable organosilane compound having one unsubstituted monovalent hydrocarbon group selected from the group consisting of alkyl groups of 1 to 4 carbon atoms, alkenyl groups of 2 to 4 carbon atoms and aryl groups of 6 to 8 carbon atoms and three hydrolyzable groups per molecule and/or a partial hydrolytic condensation product thereof;
(D) from 1,500 to 6,500 parts by weight of zinc oxide particles which have a mean particle diameter of at least 0.1 μm but not more than 2 μm and contain a proportion of coarse product having a particle diameter of 10 μm or more in laser diffraction particle size distribution that is not more than 1 vol % of component (D) overall; and
(E) from 0.01 to 30 parts by weight of an adhesion promoter exclusive of component (C);
and optionally includes also:
(F) from 0.01 to 20 parts by weight of a reaction catalyst component; and
(G) from 1 to 1,000 parts by weight of a filler component other than (D).

The composition has a content of component (D) that is from 45 to 70 vol % of the composition overall, a thermal conductivity at 25° C. as determined by the hot disk method of at least 1.3 W/mK, and is compressible to a thickness of 10 μm or less.

The invention is described in detail below.
—Component (A): Organopolysiloxane—
Component (A) is an organopolysiloxane of general formula (1) below. This organopolysiloxane has a structure in which both ends of the molecular chain are capped with a silicon-bonded hydroxyl group, i.e., a silanol group or a diorganohydroxysiloxy group. A linear organopolysiloxane of this structure serves as the base resin (base polymer having a main chain with an organopolysiloxane crosslinked structure) of the inventive composition.

[Chem. 5]

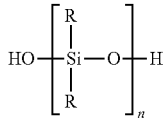

(1)

In general formula (1), each R is a substituted or unsubstituted monovalent hydrocarbon group of 1 to 20 carbon atoms, multiple occurrences of R may be the same or may be different, and n is an integer of 10 or more.

In above formula (1), the number of carbon atoms on the substituted or unsubstituted monovalent hydrocarbon groups represented by R is from 1 to 20, preferably from 1 to 10, and more preferably from 1 to 8.

Specific examples of the unsubstituted monovalent hydrocarbon groups represented by R include alkyl groups such as methyl, ethyl, n-propyl, isopropyl, n-butyl, isobutyl, tert-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl groups; cycloalkyl groups such as cyclopentyl and cyclohexyl groups; alkenyl groups such as vinyl, allyl, propenyl, isopropenyl, butenyl, pentenyl and hexenyl groups; aryl groups such as phenyl, tolyl, xylyl and α,β-naphthyl groups; and aralkyl groups such as benzyl, 2-phenylethyl and 3-phenylpropyl groups. Substituted monovalent hydrocarbon groups represented by R include groups in which some or all of the hydrogen atoms on the foregoing unsubstituted monovalent hydrocarbon groups are substituted with halogen atoms such as fluorine, chlorine or bromine, cyano groups or the like. Specific examples of these groups include 3-chloropropyl, 3,3,3-trifluoropropyl and 2-cyanoethyl groups. Of these substituted and unsubstituted monovalent hydrocarbon groups, R is preferably a methyl, ethyl or phenyl group. From the standpoint of availability, productivity and cost, methyl and phenyl groups are especially preferred.

The organopolysiloxane serving as component (A) has a viscosity at 25° C. that is preferably from 10 to 1,000,000 mPa·s, more preferably from 50 to 500,000 mPa·s, even more preferably from 100 to 200,000 mPa·s, and still more preferably from 500 to 100,000 mPa·s. Having the viscosity of the organopolysiloxane at 25° C. be 10 mPa·s or more is desirable because a coating film of excellent physical and mechanical strength can be easily obtained. Having the viscosity of the organopolysiloxane be no more than 1,000,000 mPa·s is desirable because the viscosity of the composition does not become too high and the workability at the time of use is good. The viscosities mentioned in this Specification refer to the viscosities (absolute viscosities) of the ingredients making up the composition. Unless noted otherwise, here and in the examples described below, these are all numerical values measured with a rotational viscometer. Examples of rotational viscometers include BL, BH, BS and cone/plate viscometers. As will be subsequently described, the method of measuring the absolute viscosity of the heat-conductive silicone composition differs from the method of measuring the viscosities of the individual ingredients; the absolute viscosity of the heat-conductive silicone composition is a value measured at a constant shear rate of 6 s$^{-1}$ with a spiral viscometer (coaxial double-cylindrical rotational viscometer).

The value of n in general formula (1) above is the number of difunctional diorganosiloxane units present on the molecule or the degree of polymerization. In embodiments where the organopolysiloxane serving as component (A) has a viscosity within the above preferred range, the number of difunctional diorganosiloxane units or the degree of polymerization represented by n in general formula (1) is an integer from 10 to 2,000, preferably from 50 to 1,800, more preferably from 100 to 1,700, and even more preferably from 200 to 1,600. The degree of polymerization (or molecular weight) mentioned in the Specification refers to, for example, the polystyrene-equivalent number-average degree of polymerization (or number-average molecular weight) in gel permeation chromatographic (GPC) analysis using toluene or the like as the developing solvent. The organopolysiloxane of component (A) may be used singly or two or more may be used together.

—Component (B): Organopolysiloxane—

Component (B) is a hydrolyzable organopolysiloxane of general formula (2) below having at least one alkoxysilyl or other hydrolyzable silyl group per molecule at an end of the molecular chain and/or on a side chain (non-terminal position). Component (B) serves as a surface treatment agent (dispersant or wetter) for the subsequently described zinc oxide particles (heat-conductive filler) included as component (D). Hence, interactions between component (B) and the zinc oxide particles of component (D) are strong. As a result, even when the heat-conductive silicone composition is loaded with a large amount of the zinc oxide particles of component (D), it is possible to retain the flowability of the heat-conductive silicone composition and at the same time suppress a decrease over time in the heat dissipating ability owing to oil separation and pump-out.

[Chem. 6]

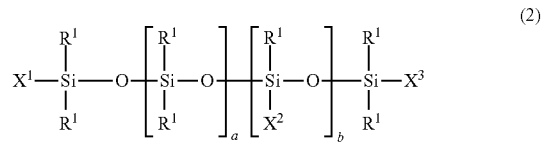

(2)

In general formula (2), each $R^1$ is independently a substituted or unsubstituted monovalent hydrocarbon group, $X^1$ and $X^3$ are each independently a group represented by $R^1$ or —$R^2$—$SiR^3_g(OR^4)_{3-g}$, and $X^2$ is a group represented by —$R^2$—$SiR^3_g(OR^4)_{3-g}$, there being at least one —$R^2$—$SiR^3_g(OR^4)_{3-g}$ moiety on the molecule. $R^2$ is an oxygen atom or an alkylene group of 1 to 4 carbon atoms, each $R^3$ is independently a substituted or unsubstituted monovalent hydrocarbon group which does not contain an aliphatic unsaturated bond, each $R^4$ is independently an alkyl group of 1 to 4 carbon atoms or an alkoxyalkyl, alkenyl or acyl group of 2 to 4 carbon atoms, and g is an integer from 0 to 2. The subscripts a and b respectively satisfy the conditions 1≤a≤1,000 and 0≤b≤1,000, with the proviso that if $X^1$ and $X^3$ are both $R^1$, b satisfies the condition 1≤b≤1,000. Each recurring unit may be randomly bonded.

In formula (2), each $R^1$ is independently a substituted or unsubstituted monovalent hydrocarbon group of preferably from 1 to 10 carbon atoms, more preferably from 1 to 6 carbon atoms, and even more preferably from 1 to 3 carbon atoms. These are exemplified by linear alkyl groups, branched-chain alkyl groups, cyclic alkyl groups, alkenyl groups, aryl groups, aralkyl groups and halogenated alkyl groups. Examples of linear alkyl groups include methyl, ethyl, propyl, hexyl and octyl groups. Examples of branched-chain alkyl groups include isopropyl, isobutyl, tert-butyl and 2-ethylhexyl groups. Examples of cyclic alkyl groups include cyclopentyl and cyclohexyl groups. Examples of alkenyl groups include vinyl and allyl groups. Examples of aryl groups include phenyl and tolyl groups. Examples of aralkyl groups include 2-phenylethyl and 2-methyl-2-phenylethyl groups. Examples of halogenated alkyl groups include 3,3,3-trifluoropropyl, 2-(nonafluorobutyl)ethyl and 2-(heptadecafluorooctyl)ethyl groups. Methyl, phenyl and vinyl groups are preferred as $R^1$.

Examples of the alkylene group of 1 to 4 carbon atoms of $R^2$ include methylene, ethylene, propylene and butylene groups. Each $R^3$ is independently a substituted or unsubstituted monovalent hydrocarbon group of preferably 1 to 10 carbon atoms, more preferably 1 to 6 carbon atoms, and even more preferably 1 to 3 carbon atoms without an aliphatic unsaturated bond. Examples include alkyl groups such as methyl, ethyl, propyl, isopropyl, butyl, isobutyl, tert-butyl, pentyl, neopentyl, hexyl, heptyl, octyl, nonyl and decyl groups; cycloalkyl groups such as cyclopentyl, cyclohexyl and cyclobutyl groups; aryl groups such as phenyl, tolyl, xylyl and naphthyl groups; aralkyl groups such as benzyl, phenylethyl, phenylpropyl and methylbenzyl groups; and groups in which some or all hydrogen atoms bonded to carbon atoms on these groups are substituted with, for example, halogen atoms such as fluorine, chlorine or bromine, cyano groups or the like.

Each $R^4$ is independently an alkyl group of 1 to 4 carbon atoms, or an alkoxyalkyl, alkenyl or acyl group of 2 to 4 carbon atoms. The alkyl group of $R^4$ is exemplified by the same alkyl groups of 1 to 4 carbon atoms as those mentioned above for $R^1$. Examples of the alkoxyalkyl group of 2 to 4 carbon atoms include methoxyethyl and methoxypropyl groups. The alkenyl group is exemplified by the same alkenyl groups of 2 to 4 carbon atoms as those mentioned above for $R^1$. Examples of the acyl group of 2 to 4 carbon atoms of $R^4$ include acetyl and propionoxy groups. $R^4$ is preferably an alkyl group, and more preferably a methyl or ethyl group.

In general formula (2), $X^1$ and $X^3$ are each independently a group represented by $R^1$ or $-R^2-SiR^3_g(OR^4)_{3-g}$. However, it is preferable for either one of $X^1$ and $X^3$ to be $R^1$ and for the other to be a group represented by $-R^2-SiR^3_g(OR^4)_{3-g}$ (i.e., for the hydrolyzable organopolysiloxane of component (B) to have a hydrolyzable silyl group at one end of the molecular chain).

The subscripts a and b are as defined above, but preferably satisfy the conditions $10 \leq a \leq 1{,}000$ and $0 \leq b \leq 1{,}000$, more preferably satisfy the conditions $10 \leq a \leq 300$ and $0 \leq b \leq 30$, even more preferably satisfy the conditions $12 \leq a \leq 100$ and $0 \leq b \leq 10$, and most preferably satisfy the conditions $14 \leq a \leq 50$ and $b=0$. Also, the sum a+b is preferably from 10 to 1,000, more preferably from 10 to 300, even more preferably from 12 to 100, and most preferably from 14 to 50. The subscript g is an integer from 0 to 2, and is preferably 0. It is preferable for the number of $OR^4$ groups on the molecule to be from 1 to 6, and especially either 3 or 6. The siloxane units shown in brackets may each be randomly bonded. The hydrolyzable organopolysiloxane of component (B) has a hydrolyzable silyl group such as an alkoxysilyl group on an end of the molecular chain and/or on a side chain (non-terminal position), although it is preferable for this organopolysiloxane to have a hydrolyzable silyl group on at least an end (one or both ends) of the molecular chain, and especially preferable for it to have a hydrolyzable silyl group on only one end of the molecular chain.

Preferred examples of component (B) include those shown below.

[Chem. 7]

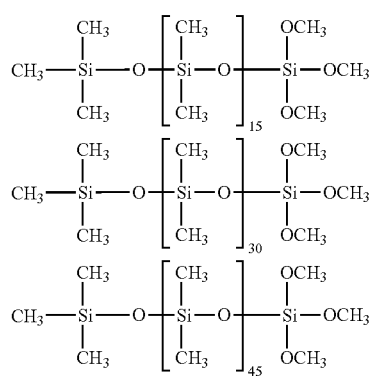

Component (B) is the chief component of the silicone matrix in the heat-conductive silicone composition of the invention (i.e., the component included in the largest amount within the organopolysiloxane components included in the overall composition). The content thereof per 100 parts by weight of component (A) is from 150 to 600 parts by weight, and preferably from 160 to 500 parts by weight. The content of component (B) in the overall heat-conductive silicone composition is preferably from 20 to 40 vol %, and more preferably from 25 to 35 vol %. By including component (B) in this range, the composition can be prevented from undergoing a decline in heat resistance due to oil separation or pump-out while at the same time retaining a good compressibility.

The content (vol %) of component (B) with respect to the overall heat-conductive silicone composition is the proportion by volume of the composition that is accounted for by component (B). The content (vol %) of component (B) with respect to the overall heat-conductive silicone composition can be obtained as follows by determining the volume of component (B) from the included amount (weight) and density of component (B) and calculating the sum of the volumes for the overall heat-conductive silicone composition determined from the respective included amounts (weights) and densities of all the ingredients:

{volume of component(B)}/{sum of volumes of heat-conductive silicone composition overall}× 100(%).

Component (B) may be used singly or two or more by added in combination.

—Component (C): Crosslinking Agent—

Component (C) is a hydrolyzable organosilane compound other than component (B) having one unsubstituted monovalent hydrocarbon group selected from among alkyl groups of 1 to 4 carbon atoms, alkenyl groups of 2 to 4 carbon atoms and aryl groups of 6 to 8 carbon atoms and having three hydrolyzable groups (making the compound trifunctional) per molecule and/or a partial hydrolytic condensation product thereof (an organosiloxane oligomer having three or more remaining hydrolyzable groups on the molecule formed by partial hydrolytic condensation of the hydrolyzable organosilane compound). The hydrolyzable organosilane compound is represented by the formula

(wherein Y is an unsubstituted monovalent hydrocarbon group selected from among alkyl groups of 1 to 4 carbon atoms, alkenyl groups of 2 to 4 carbon atoms and aryl groups of 6 to 8 carbon atoms, and X is a hydrolyzable group).

Here, in the unsubstituted monovalent hydrocarbon group of the above formula $Y-Si-X_3$, examples of Y include alkyl groups of 1 to 4 carbon atoms such as methyl, ethyl, propyl, isopropyl, butyl, isobutyl, sec-butyl and tert-butyl groups; alkenyl groups of 2 to 4 carbon atoms such as vinyl, allyl, propenyl, isopropenyl, butenyl and isobutenyl groups; and aryl groups of 6 to 8 carbon atoms such as phenyl, tolyl, xylyl and ethylphenyl groups. Methyl and ethyl groups are preferred as the alkyl groups of 1 to 4 carbon atoms; vinyl and allyl groups are preferred as the alkenyl groups of 2 to 4 carbon atoms; and phenyl and tolyl groups are preferred as the aryl groups of 6 to 8 carbon atoms. Methyl, vinyl and phenyl groups are more preferred.

Component (C) is used as a crosslinking agent (chain extender). Amino groups are not present on the above condensation product serving as component (C). Where necessary, an organosilane compound having two hydrolyzable groups ($Y_2-SiX_2$) and/or a silane compound having four hydrolyzable groups ($SiX_4$) may be additionally included as an optional ingredient together with the above-described trifunctional hydrolyzable organosilane and/or partial hydrolytic condensation product thereof serving as component (C).

The hydrolyzable groups included in component (C) are exemplified by alkoxy groups of 1 to 20 carbon atoms, preferably 1 to 10 carbon atoms and more preferably 1 to 4 carbon atoms, such as methoxy, ethoxy, propoxy, isopropoxy, butoxy, isobutoxy, sec-butoxy and tert-butoxy groups; alkoxy-substituted alkoxy groups of 2 to 40 carbon atoms, preferably 2 to 10 carbon atoms, and more preferably 2 to 4 carbon atoms, such as methoxymethoxy and methoxyethoxy groups; alkenyloxy groups of 2 to 20 carbon atoms, preferably 2 to 10 carbon atoms, and more preferably 2 to 5 carbon atoms, such as vinyloxy, allyloxy, propenoxy and isopropenoxy groups; ketoxime groups of 3 to 20 carbon atoms, preferably 3 to 10 carbon atoms, and more preferably 3 to 6 carbon atoms, such as dimethyl ketoxime, diethyl ketoxime and methyl ethyl ketoxime groups; and acyloxy groups of 2 to 20 carbon atoms, preferably 2 to 10 carbon atoms, and more preferably 2 to 5 carbon atoms, such as the acetoxy group.

Specific examples of component (C) include the following trifunctional organo hydrolyzable silane compounds: trifunctional organoalkoxysilane compounds such as methyltrimethoxysilane, methyltriethoxysilane, methyltriisopropoxysilane, vinyltrimethoxysilane, vinyltriethoxysilane, vinyltriisopropoxysilane, phenyltrimethoxysilane, phenyltriethoxysilane and phenyltriisopropoxysilane; trifunctional organo-substituted alkoxysilane compounds such as methyltris(methoxyethoxy)silane, vinyltris(methoxyethoxy)silane and phenyltris(methoxyethoxy)silane; trifunctional organoalkenyloxysilane compounds such as methyltriisopropenoxysilane, vinyltriisopropenoxysilane and phenyltriisopropenoxysilane; trifunctional organoacyloxysilane compounds such as methyltriacetoxysilane, vinyltriacetoxysilane and phenyltriacetoxysilane; and trifunctional organo ketoxime silane compounds such as methyltris(methyl ethyl ketoxime)silane, vinyltris(methyl ethyl ketoxime)silane and phenyltris(methyl ethyl ketoxime)silane; and also partial hydrolytic condensation products (organosiloxane oligomers having three or more remaining hydrolyzable groups on the molecule) of these hydrolyzable organosilane compounds. However, component (C) is not limited to these specific examples. One of the corresponding compounds may be used singly or two or more may be used in combination as component (C).

Component (C) is used in a range in content per 100 parts by weight of the organopolysiloxane of component (A) of from 0.1 to 100 parts by weight, preferably from 0.1 to 25 parts by weight, and more preferably from 0.5 to 18 parts by weight. At a component (C) content below 0.1 part by weight, sufficient crosslinking does not take place, making it difficult to obtain a composition of the desired viscosity. At a content greater than 100 parts by weight, the mechanical properties of the resulting composition decrease, in addition to which use in such an amount is uneconomical.

—Component (D): Zinc Oxide Particles—

The heat-conductive silicone composition of the invention includes (D) zinc oxide particles as a heat-conductive filler. Zinc oxide has a high thermal conductivity comparable to that of metal oxides such as aluminum oxide and magnesium oxide. Therefore, so long as a necessary and sufficient amount of the zinc oxide particles (D) can be loaded into the composition, a heat-conductive silicone composition having a relatively high thermal conductivity can be obtained. The mean particle diameter of the zinc oxide particles of component (D) is at least 0.1 μm but not more than 2 μm, and preferably at least 0.2 μm but not more than 1.5 μm. When the mean particle diameter of the zinc oxide particles of component (D) exceeds 2 μm, the compressibility of the resulting heat-conductive silicone composition markedly worsens. When the mean particle diameter of the zinc oxide particles (D) is less than 0.1 μm, the viscosity of the heat-conductive silicone composition markedly increases.

The mean particle diameter refers to the volume mean particle diameter (cumulative mean diameter $D_{50}$ (median diameter)) obtained with a Microtrac (laser diffraction scattering method). For example, the mean particle diameter can be measured with the Microtrac MT-3300EX from Nikkiso Co., Ltd.

The content (included proportion) in component (D) of coarse product (coarse particles) having a particle diameter of 10 μm or more in laser diffraction particle size distribution is not more than 1 vol % of component (D) overall. At a content of this coarse product in excess of 1 vol %, the thickness of the heat-conductive silicone composition when compressed cannot be made 10 μm or less. In order to set the coarse product to this content, it is preferable to treat the powder beforehand by classification using a hitherto known means. Alternatively, zinc oxide powder (component (D)) having the specified content of coarse product is available as commercial product in zinc oxide grades 1, 2 or 3, for example.

The content of this coarse product (coarse particles) can be easily determined from measurements of the particle size distribution of component (D) overall by the laser diffraction scattering method using, for example, the Microtrac MT-3300EX from Nikkiso Co., Ltd.

The heat-conductive silicone composition of the invention contains from 1,500 to 6,500 parts by weight, preferably from 2,000 to 6,000 parts by weight, of the zinc oxide particles of component (D) per 100 parts by weight of component (A). Moreover, component (D) accounts for from 45 to 70 vol %, preferably from 55 to 65 vol %, of the overall heat-conductive silicone composition. At a zinc oxide particle (D) content below 1,500 parts by weight or below 45 vol %, the thermal conductivity of the heat-conductive silicone composition decreases; at a content greater than 6,500 parts by weight or 70 vol %, uniformity of the heat-conductive silicone composition is not achieved.

The content (vol %) of the zinc oxide particles serving as component (D) with respect to the overall heat-conductive silicone composition is the proportion by volume of the composition that is accounted for by component (D). The content (vol %) of component (D) with respect to the overall heat-conductive silicone composition can be obtained as follows by determining the volume of component (D) from the added amount (weight) and density of component (D) and calculating the sum of the volumes for the overall heat-conductive silicone composition determined from the respective added amounts (weights) and densities of all the ingredients:

$$\{\text{volume of component(D)}\}/\{\text{sum of volumes of heat-conductive silicone composition overall}\} \times 100(\%)$$

In the heat-conductive silicone composition of the invention, it is preferable for component (D) to be surface-treated with component (B).

—Component (E): Adhesion Promoter—

The adhesion promoter serving as component (E) is a compound exclusive of component (C) and is used to impart the necessary adhesiveness to the heat-conductive silicone composition of the invention. A known silane coupling agent may be suitably used as the adhesion promoter of component (E). Compounds that may be suitably used as the silane coupling agent include carbon functional group-containing hydrolyzable silanes (known as "carbon functional silanes") having on the molecule a monovalent hydrocarbon group containing a functional group that includes at least one heteroatom such as an oxygen atom, nitrogen atom or sulfur atom (carbon functional group), as exemplified by (meth) acrylic silane coupling agents, epoxy silane coupling agents, amino silane coupling agents, mercapto silane coupling agents and isocyanate silane coupling agents.

Specific examples include (meth)acrylic silanes such as γ-(meth)acryloxypropyltrimethoxysilane; epoxy silanes such as β-(3,4-epoxycyclohexyl)ethyltrimethoxysilane, γ-glycidoxypropyltrimethoxysilane and γ-glycidoxypropylmethyldiethoxysilane; amino silanes (exclusive of guanidyl group-containing hydrolyzable silanes) such as 3-aminopropyltriethoxysilane and N-β-(aminoethyl)-γ-aminopropyltrimethoxysilane; mercapto silanes such as γ-mercaptopropyltrimethoxysilane; isocyanate silanes such as 3-isocyanatopropyltriethoxysilane; and compounds obtained by the partial hydrolysis and condensation of these (carbon functional group-containing organosiloxane oligomers with hydrolyzable groups remaining on the molecule).

Of these specific examples of component (E), epoxy silanes such as γ-glycidoxypropyltrimethoxysilane and β-(3,4-epoxycyclohexyl)ethyltrimethoxysilane; amino silanes such as 3-aminopropyltriethoxysilane and N-β-(aminoethyl)-γ-aminopropyltrimethoxysilane; and isocyanate silanes such as 3-isocyanatopropyltriethoxysilane are preferred.

The component (E) content per 100 parts by weight of component (A) is from 0.01 to 30 parts by weight, and especially from 0.1 to 20 parts by weight. At a component (E) content per 100 parts by weight of component (A) that is less than 0.01 part by weight, sufficient adhesiveness cannot be imparted to the inventive composition. At a component (E) content greater than 30 parts by weight, the mechanical properties of the resulting composition decrease, in addition to which such a high content may be uneconomical.

—Component (F): Reaction Catalyst—

The reaction catalyst of component (F) is an optional ingredient that may be included where necessary. A nonmetallic organic catalyst and/or a metallic catalyst may be used as this reaction catalyst. Component (F) acts to promote curing (rise in viscosity) of the heat-conductive silicone composition of the invention.

Of the reaction catalysts of component (F), the nonmetallic organic catalysts are not particularly limited, although use can be made of those which are known to be curing (rise in viscosity) promoters. Examples include phosphazene-containing compounds such as N,N,N',N',N'',N''-hexamethyl-N'''-(trimethylsilylmethyl)-phosphorimidic triamide; amine compounds and salts thereof such as hexylamine and dodecylamine phosphate; quaternary ammonium salts such as benzyltriethylammonium acetate; dialkylhydroxylamines such as dimethylhydroxylamine and diethylhydroxylamine; and guanidyl group-containing silanes and siloxanes such as N,N,N',N'-tetramethylguanidylpropyltrimethoxysilane, N,N,N',N'-tetramethylguanidylpropylmethyldimethoxysilane and N,N,N',N'-tetramethylguanidylpropyltris(trimethylsiloxy)silane. The nonmetallic organic catalyst may be used singly or two or more may be used in admixture.

Of the reaction catalyst of component (F), the metallic catalysts are not particularly limited, although use can be made of those which are known to be curing (rise in viscosity) promoters. Examples include the following organometallic compounds: alkyltin ester compounds such as dibutyltin diacetate, dibutyltin dilaurate, dibutyltin dioctoate, dioctyltin dineodecanoate and di-n-butyl-dimethoxytin; titanate esters or titanium chelate compounds such as tetraisopropoxytitanium, tetra-n-butoxytitanium, tetrakis(2-ethylhexoxy)titanium, dipropoxybis(acetylacetonato)titanium and titanium isopropoxyoctylene glycol; zinc naphthenate, zinc stearate and zinc 2-ethyloctoate; aluminum alcoholate compounds such as aluminum isopropylate and aluminum secondary butyrate; aluminum chelate compounds such as aluminum alkyl acetate diisopropylate and aluminum bis(ethyl acetoacetate)/monoacetylacetonate; and bismuth(III) neodecanoate, bismuth(III) 2-ethylhexanoate, bismuth(III) citrate, bismuth ocrylate, iron 2-ethylhexoate, cobalt 2-ethylhexoate, manganese 2-ethylhexoate and cobalt naphthenate. Additional examples include lower fatty acid salts of alkali metals, such as potassium acetate, sodium acetate and lithium oxalate. However, the metallic catalysts are not limited to these. The metallic catalyst may be used singly or two or more may be used in admixture.

A small catalytic amount suffices as the content of component (F). When the reaction catalyst of component (F) is included, the content thereof per 100 parts by weight of component (A) is from 0.01 to 20 parts by weight, preferably from 0.05 to 10 parts by weight, and more preferably from 0.05 to 5 parts by weight. At a component (F) content below 0.01 part by weight, a good reactivity (rise in viscosity) cannot be obtained, as a result of which the reaction rate becomes slow, which is undesirable. At more than 20 parts by weight, the reaction rate of the composition is too rapid, as a result of which the working time following application of the composition may become short.

—Component (G): Filler—

The filler serving as component (G) is an optional ingredient that may be included if necessary. This component (G) is a filler (inorganic filler and/or organic resin filler) other than the zinc oxide particles of component (D), and is used to impart a sufficient mechanical strength to the composition. A known substance may be used as the filler of component (G). Examples include finely powdered silica, pyrogenic silica, fumed silica (dry silica), precipitated silica (wet silica), sol-gel silica, and any of these silicas subjected to surface hydrophobization with an organosilicon compound; glass beads; glass balloons; clear resin beads; silica aerogel; metal oxides such as diatomaceous earth, iron oxide, titanium oxide and fumed metal oxides; wet silicas and any of these which have been surface treated with a silane; reinforcing agents such as quartz powder (crystalline silica), talc, zeolite and bentonite; asbestos, glass fibers, carbon fibers, and metal carbonates such as calcium carbonate, magnesium carbonate and zinc carbonate; glass wool, finely divided mica, fused silica powder, and synthetic resin powders such as polystyrene, polyvinyl chloride and polypropylene. Of the fillers mentioned above, inorganic fillers such as silica, calcium carbonate and zeolite are preferred; fumed silica that has been subjected to surface hydrophilization and calcium carbonate are especially preferred.

The average particle size of the filler of component (G) is preferably at least 0.1 μm but not more than 2 μm, and more preferably at least 0.2 μm but not more than 1.5 μm.

Zinc oxides which satisfy the requirements for a given mean particle diameter and a given coarse product content defined for component (D) above are not encompassed by the filler of component (G).

When component (G) is included, the content thereof per 100 parts by weight of component (A) is from 1 to 1,000 parts by weight, preferably from 3 to 500 parts by weight, and more preferably from 5 to 300 parts by weight. When more than 1,000 parts by weight is used, the viscosity of the composition increases and the workability worsens. When the content of component (G) is less than 1 part by weight, the mechanical strength of the resulting composition cannot be made sufficiently high. As with the zinc oxide particles of component (D), the filler of component (G) preferably has a content (included proportion) of coarse product (coarse particles) having a particle diameter of 10 μm or more in laser diffraction particle size distribution which is not more than 1 vol % of component (G) overall. At a content of this coarse product within component (G) in excess of 1 vol %, it may be difficult to make the thickness of the heat-conductive silicone composition when compressed 10 μm or less. When component (G) is included, the amount thereof is preferably not more than 2 wt %, and more preferably not more than 1 wt %, of the component (D) content.

—Organopolysiloxane—

In addition to above components (A) to (G), if necessary, the heat-conductive silicone composition of the invention may further include as an optional ingredient (H) a linear diorganopolysiloxane of general formula (3) below (a so-called non-functional silicone oil).

[Chem. 8]

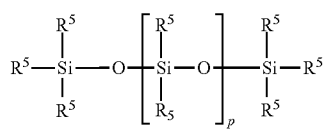

(3)

In general formula (3), $R^5$ is a monovalent hydrocarbon group of 1 to 20 carbon atoms which may have substituents and which has no aliphatic unsaturated bonds, and p is an integer from 1 to 2,000.

In formula (3), the substituted or unsubstituted monovalent hydrocarbon group $R^5$ having no aliphatic unsaturated bonds has from 1 to 20, preferably from 1 to 10, and more preferably from 1 to 8, carbon atoms. Multiple occurrences of $R^5$ may be mutually the same or may be different. Examples of the unsubstituted monovalent hydrocarbon group $R^5$ in formula (3) include alkyl groups such as methyl, ethyl, n-propyl, isopropyl, n-butyl, isobutyl, tert-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl groups; cycloalkyl groups such as cyclopentyl and cyclohexyl groups; aryl groups such as phenyl, tolyl, xylyl and a- and 3-naphthyl groups; and aralkyl groups such as benzyl, 2-phenylethyl and 3-phenylpropyl groups. Substituted monovalent hydrocarbon groups are exemplified by these unsubstituted monovalent hydrocarbon groups in which some or all hydrogen atoms are substituted with halogen atoms such as fluorine, chlorine or bromine, cyano groups or the like; specific examples include 3-chloropropyl, 3,3,3-trifluoropropyl and 2-cyanoethyl groups. Of these, methyl, ethyl and phenyl groups are preferred; from the standpoint of availability, productivity and cost, methyl and phenyl groups are more preferred. It is especially preferable for all occurrences of $R^5$ in formula (3) to be methyl groups. Component (H) is preferably a dimethylpolysiloxane in which both ends of the molecular chain are capped with trimethylsiloxy groups.

In formula (3), p is a numerical value representing the degree of polymerization of component (H), this being an integer from 1 to 2,000, preferably from 2 to 2,000, and more preferably from 20 to 2,000. When p is a numerical value in the above range, the viscosity at 25° C. of the diorganopolysiloxane of component (H) is from 1.5 to 1,000,000 mPa·s, and preferably from 30 to 100,000 mPa·s.

When component (H) is included, the content thereof per 100 parts by weight of component (A) is preferably from 0.01 to 100 parts by weight, and more preferably from 10 to 80 parts by weight. An amount of component (H) within this range is preferable in terms of not compromising the mechanical properties and flame retardancy of the heat-conductive silicone composition of the invention. Also, this composition may be adjusted to an elastic modulus and viscosity that makes it easy to handle when applied.

[Other Ingredients]

Where necessary, a known antioxidant such as 2,6-di-t-butyl-4-methylphenol may be included in the heat-conductive silicone composition of the invention in order to prevent deterioration of the composition. Also, thixotropic agents, dyes, pigments, flame retardants, sedimentation inhibitors, thixotropy modifiers and the like may be optionally included.

[Production of Heat-Conductive Silicone Composition]

The inventive method for producing a heat-conductive silicone composition is described.

The inventive method for producing a heat-conductive silicone composition is a method for producing the above described heat-conductive silicone composition of the invention that is characterized by including the step of mixing together components (A), (B), (C), (D) and (E).

As an example of this production method, the heat-conductive silicone composition of the invention can be produced by mixing together (all at once and at the same time) above components (A), (B), (C), (D) and (E) at normal pressure or under reduced pressure, preferably under a reduced pressure of from 0.09 to 0.01 MPa, and then further mixing this mixture under an absence of heating, preferably 60° C. or below, for a period of from about 30 minutes to about 3 hours. In this production method, when ingredients other than components (A), (B), (C), (D) and (E) are also added, this should be done when starting to mix components (A), (B), (C), (D) and (E) at normal pressure or under reduced pressure.

Alternatively, the inventive method for producing a heat-conductive silicone composition is a method for producing the above described heat-conductive silicone composition of the invention that is characterized by including the step of mixing component (B), or components (A) and (B), together with component (D) at a temperature of 100° C. or more, preferably at least 150° C. and not more than 250° C., for at least 30 minutes, preferably at least 40 minutes and not more than 6 hours.

Specifically, this invention preferably includes the steps of mixing together component (B), or components (A) and (B), with component (D), and then mixing therein at least components (C) and (E) and also, where necessary, other optional ingredients.

That is, first components (B) and (D), or components (A), (B) and (D), are mixed together under reduced pressure and are mixed under heating, specifically at between 100° C. and 250° C., for a period of from about 30 minutes to about 6 hours. Next, components (C) and (E), and other ingredients that may be included where necessary, are mixed into this mixture under normal pressure or under a reduced pressure of from 0.09 to 0.01 MPa. By subsequently carrying out mixture under an absence of heating, preferably at 60° C. or below, for a period of generally from about 30 minutes to about 3 hours, the inventive composition can be produced.

The mixing apparatus is not particularly limited. For example, mixing may be carried out using a mixer such as the Trimix, Twinmix or Planetary Mixer (all registered trademarks of mixers manufactured by Inoue Mfg., Inc.), the Ultra Mixer (registered trademark of mixers manufactured by Mizuho Industrial Co., Ltd.) or the HIVIS DISPER MIX (registered trademark of mixers manufactured by Tokushu Kika Kogyo KK). Also, finishing treatment on a three-roll mill or the like may be carried out in order to break up agglomerates of the zinc oxide particles (D) serving as the heat-conductive filler.

With this production method, a heat-conductive silicone composition can be produced that has a higher thermal conductivity than conventional heat-conductive silicone compositions and good compressibility to a thickness of 10 μm or less.

During the step of mixing component (B), or components (A) and (B), with component (D), by carrying out mixture for 30 minutes or more at a temperature of at least 100° C., component (D) is fully surface-treated by component (B), making it possible to keep the heat resistance from worsening over time.

[Properties of Silicone Composition]

The inventive heat-conductive silicone composition obtained as described above has a higher thermal conductivity than conventional heat-conductive silicone compositions and the compressibility to a thickness of 10 μm or less is good.

The inventive heat-conductive silicone composition has a thermal conductivity at 25° C., as determined by the hot disk method, which is 1.3 W/mK or more. For details on the procedure for measuring thermal conductivity, see, for example, the method described subsequently in the "EXAMPLES" section.

The heat-conductive silicone composition of the invention has a good compressibility. The thickness of the heat-conductive silicone composition when a pressure of 4.1 MPa is applied for 2 minutes is 10 μm or less, preferably in the range of 0.5 to 10 μm, and more preferably from 0.5 to 5 μm. The method used to measure the thickness when pressurization has been carried out may be, for example, the method described subsequently in the "EXAMPLES" section.

Because the heat-conductive silicone composition of the invention has both a high thermal conductivity and a good compressibility, it has a low heat resistance. The heat resistance of the heat-conductive silicone composition, as measured at 25° C. by the laser flash method, is preferably 5 mm$^2$·K/W or less, and more preferably 3 mm$^2$·K/W or less. Although there is no particular lower limit, for physical reasons, the lower limit may be set to, for example, 0.1 mm$^2$·K/W. When the heat resistance is at or below a given value, the thermal conductivity of the heat-conductive silicone composition increases further. For details on the procedure for measuring heat resistance, see, for example, the method described subsequently in the "EXAMPLES" section.

The absolute viscosity of the heat-conductive silicone composition of the invention, as measured at 25° C., is preferably from 3 to 600 Pa·s, and more preferably from 10 to 600 Pa·s. At an absolute viscosity of 3 Pa·s or more, shape retention is easy and the workability is good. On the other hand, at an absolute viscosity of 600 Pa·s or less, discharge is easy, and so the workability is good. The absolute viscosity can be adjusted by including the above-described ingredients. In this invention, the absolute viscosity is the value measured at 25° C. and a shear rate of 6 s$^{-1}$ with a spiral viscometer from Malcolm Co., Ltd.

[Semiconductor Device]

The semiconductor device of the invention is characterized by having an insulated gate bipolar transistor (IGBT) or other heat-generating body and a cooling body between which is formed a gap not thicker than 10 μm, and a layer of the inventive heat-conductive silicone composition that fills the gap, which composition layer is thermally interposed between the heat-generating body and the cooling body. The heat-conductive silicone composition of the invention is compressed to a thickness of 10 μm or less, which can be expected to increase the cooling efficiency compared with conventional heat-conductive silicone compositions.

FIG. 1 shows a typical construction, although the invention is not limited to this.

In the semiconductor device shown in FIG. 1, a heat-conductive silicone composition layer 2 made of the heat-conductive silicone composition of the invention is interposed in a gap between the heat-generating body 1 and the cooling body 3. The cooling body 3 has an electrically insulating layer 3a provided on a side thereof in contact with the heat-conductive silicone composition 2.

It is preferable here for the heat-generating body 1 to be an insulated gate bipolar transistor (IGBT). When the heat-generating body 1 is an IGBT, the IBGT in this semiconductor device is efficiently cooled.

It is preferable for the cooling body 3 to be a cooling fin (composed of a flat plate and heat-dissipating projections provided on one main side of the flat plate) that is made of a material having good heat conductivity.

The electrically insulating layer 3a is a thin film having a thickness of from 10 to 1,000 μm which is made of an electrically insulating material of good heat conductivity, such as silicon nitride, aluminum nitride or diamond, and is formed on the side of the cooling body 3 (cooling fin) where the heat-conductive silicone composition layer 2 is provided (i.e., the flat plate of the cooling fin).

The heat-conductive silicone composition layer 2 is obtained by providing the inventive heat-conductive silicone composition in the form of a layer in the gap between the back side of the heat-generating body 1 (IGBT) and the flat side of the cooling body 3 (cooling fin). The thickness of the heat-conductive silicone composition layer 2 is 10 μm or less, preferably in the range of 0.5 to 10 μm, and more preferably from 0.5 to 5 μm.

By employing such a semiconductor device construction, heat generated by the heat-generating body 1 is transmitted to the cooling body 3 through the heat-conductive silicone composition 2 and then dissipated to the exterior—in the case of FIG. 1, to cooling water 4 that comes into contact with the cooling body 3.

The method of fabricating the semiconductor device of the invention is not particularly limited. However, in order to make the thickness of the heat-conductive silicone composition 10 μm or less, assembly is carried out under a pressure of preferably at least 0.1 MPa, and more preferably at least 4.0 MPa. The time required for compression can be reduced by increasing the pressure during pressurization of the heat-conductive silicone composition.

The heat-conductive silicone composition of the invention does not give rise to contact faults with electrical and electronic components, and so is useful as an insulating material or adhesive for electrical and electronic components.

EXAMPLES

The invention is illustrated more fully below by way of Examples and Comparative Examples, although the invention is not limited by these Examples. The mean particle diameter of the zinc oxide particles (D) and the content (vol %) of coarse product having a particle diameter of 10 μm or more in this component (D) were measured by the laser diffraction particle size distribution method (laser diffraction scattering method) using, for example, the Microtrac MT-3300EX from Nikkiso Co., Ltd.

The ingredients used were as follows.

[Component (A)]
- (A-1) A dimethylpolysiloxane capped at both ends of the molecular chain with hydroxyl groups and having a viscosity at 25° C. of 700 mPa·s (n in formula (1) is about 268)
- (A-2) A dimethylpolysiloxane capped at both ends of the molecular chain with hydroxyl groups and having a viscosity at 25° C. of 20,000 mPa·s (n in formula (1) is about 615)
- (A-3) A dimethylpolysiloxane capped at both ends of the molecular chain with hydroxyl groups and having a viscosity at 25° C. of 50,000 mPa·s (n in formula (1) is about 886)
- (A-4) A dimethylpolysiloxane capped at both ends of the molecular chain with hydroxyl groups and having a viscosity at 25° C. of 100,000 mPa·s (n in formula (1) is about 1,589)

[Component (B)]
- (B-1) A dimethylpolysiloxane of the following formula capped at one end with a trimethoxysilyl group

[Chem. 9]

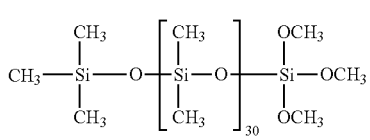

(B-1)

- (B-2) A dimethylpolysiloxane of the following formula capped at one end with a trimethoxysilyl group

[Chem. 10]

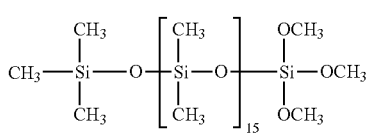

(B-2)

- (B-3) A dimethylpolysiloxane of the following formula capped at one end with a trimethoxysilyl group

[Chem. 11]

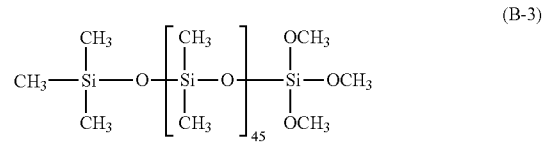

(B-3)

- (B') A dimethylpolysiloxane of the following formula having no hydrolyzable functional groups (comparative product)

[Chem. 12]

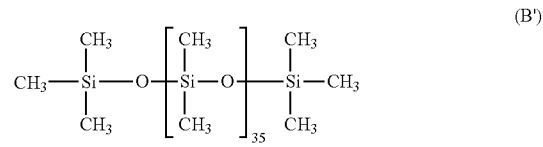

(B')

[Component (C)]
- (C-1) Phenyltriisopropenoxysilane
- (C-2) Vinyltriisopropenoxysilane
- (C-3) Methyltrimethoxysilane

[Component (D)]
- (D-1) Zinc oxide particles having a mean particle diameter of 1.0 μm and containing vol % of coarse product having a particle diameter of 10 μm or more
- (D') Zinc oxide particles having a mean particle diameter of 40.0 μm and containing ≥80 vol % of coarse product having a particle diameter of 10 μm or more

[Component (E)]
- (E-1) 3-Aminopropyltriethoxysilane

[Component (F)]
- (F-1) N,N,N',N'-Tetramethylguanidylpropyltrimethoxysilane

[Component (G)]
- (G) Dry silica having a BET specific surface area of 130 $m^2$/g (containing ≤0.1 vol % of coarse product having a particle diameter of 10 μm or more)

Examples 1 to 20, Comparative Examples 1 to 4

<Preparation of Heat-Conductive Silicone Compositions>

Heat-conductive silicone compositions were prepared by compounding components (A) to (G) in the amounts shown in Tables 1 to 5 below using the method shown below.

Components (A), (B) and (D) were added to a 5-liter Planetary Mixer (Inoue Mfg., Inc.) and mixed together for 1 hour at 170° C. After the mixture was cooled to room temperature, components (C) and (E) were added and mixed to uniformity, thereby preparing a heat-conductive silicone composition.

Where necessary, components (F) and (G) were then added and mixed in, following which the heat-conductive silicone composition was prepared.

The viscosity, thermal conductivity, compressibility and heat resistance of the heat-conductive compositions obtained as described above were measured by the following methods. The results are shown in Tables 1 to 5.

[Absolute Viscosity]

The absolute viscosities of the heat-conductive silicone compositions were measured at 25° C. and a rotational velocity (shear rate) of 6 s$^{-1}$ using a spiral viscometer from Malcolm Co., Ltd.

[Thermal Conductivity]

Each heat-conductive silicone composition was wrapped in food wrap and the thermal conductivity of a drawstring purse-shaped test specimen was measured by the hot disk method at 25° C. with the TPA-501 from Kyoto Electronics Manufacturing Co., Ltd.

[Compressibility]

The heat-conductive silicone composition that was produced was sandwiched to a thickness of 75 μm between two metal plates (silicon wafers) cut into 1 mm diameter disks and then subjected to 4.1 MPa of applied pressure for 2 minutes using the Autograph AG-5KNZPLUS from Shimadzu Corporation, following which the minimum thickness was measured. The minimum thickness of the heat-conductive silicone composition was determined by using two metal disks and treating the combined thickness of the two metal disks when compressed with nothing therebetween as the initial value, measuring the thickness when the heat-conductive silicone composition is placed between the two metal disks and compression is carried out following measurement of the initial value, and subtracting the initial value (combined thickness of the two metal disks) from the latter thickness.

[Heat Resistance]

Using the test specimen described above, the heat resistance was measured at 25° C. based on the laser flash method using a heat resistance analyzer (the LFA 447 NanoFlash xenon flash analyzer from Netzsh-Geratebau GmbH).

[Heat Resistance after Heat Cycling]

Using the TSE-11A thermal shock chamber from Espec Corporation, the test specimen described above was subjected to a 1,000-cycle thermal shock test in which one cycle consisted of −40° C.×30 minutes→150° C.×30 minutes, following which the heat resistance was measured at 25° C.

TABLE 1

| | | Example | | | | |
|---|---|---|---|---|---|---|
| | | 1 | 2 | 3 | 4 | 5 |
| Composition (pbw) | (A-1) | 100 | 100 | 100 | 100 | 0 |
| | (A-2) | 0 | 0 | 0 | 0 | 100 |
| | (A-3) | 0 | 0 | 0 | 0 | 0 |
| | (A-4) | 0 | 0 | 0 | 0 | 0 |
| | (B-1) | 160 | 160 | 480 | 480 | 500 |
| | (B-2) | 0 | 0 | 0 | 0 | 0 |
| | (B-3) | 0 | 0 | 0 | 0 | 0 |
| | (B') comparative product | 0 | 0 | 0 | 0 | 0 |
| | (C-1) | 16 | 16 | 16 | 16 | 8 |
| | (C-2) | 0 | 0 | 0 | 0 | 0 |
| | (C-3) | 0 | 0 | 0 | 0 | 0 |
| | (D-1) | 2,000 | 2,000 | 4,800 | 5,100 | 5,000 |
| | (D') comparative product | 0 | 0 | 0 | 0 | 0 |
| | (E-1) | 1 | 1 | 1 | 2 | 3 |
| | (F-1) | 2.0 | 2.0 | 0.0 | 0.0 | 0.0 |
| | (G) | 16 | 0 | 0 | 0 | 0 |
| Component (B) (vol %) | | 25 | 25 | 33 | 32 | 33 |
| Component (D) (vol %) | | 55 | 56 | 59 | 60 | 59 |
| Evaluation results | Absolute viscosity (Pa · s) | 600 | 550 | 106 | 340 | 74 |
| | Thermal conductivity (W/mK) | 1.4 | 1.5 | 1.6 | 1.7 | 1.6 |
| | Minimum thickness (μm) | 2.1 | 2.5 | 3.4 | 4.8 | 4.3 |
| | Thermal resistance (mm$^2$ · K/W) | 1.5 | 1.7 | 2.1 | 2.9 | 2.6 |
| | Thermal resistance after heat cycling (mm$^2$ · K/W) | 1.6 | 1.7 | 2.2 | 3.0 | 2.8 |

TABLE 2

| | | Example | | | | |
|---|---|---|---|---|---|---|
| | | 6 | 7 | 8 | 9 | 10 |
| Composition (pbw) | (A-1) | 0 | 0 | 0 | 0 | 0 |
| | (A-2) | 100 | 100 | 100 | 0 | 0 |
| | (A-3) | 0 | 0 | 0 | 100 | 100 |
| | (A-4) | 0 | 0 | 0 | 0 | 0 |
| | (B-1) | 500 | 477 | 480 | 480 | 480 |
| | (B-2) | 0 | 0 | 0 | 0 | 0 |
| | (B-3) | 0 | 0 | 0 | 0 | 0 |
| | (B') comparative product | 0 | 0 | 0 | 0 | 0 |
| | (C-1) | 7 | 7 | 8 | 8 | 8 |
| | (C-2) | 0 | 0 | 0 | 0 | 0 |
| | (C-3) | 0 | 0 | 0 | 0 | 0 |
| | (D-1) | 5,750 | 5,091 | 5,100 | 4,800 | 5,000 |
| | (D') comparative product | 0 | 0 | 0 | 0 | 0 |
| | (E-1) | 3 | 4 | 4 | 2 | 2 |
| | (F-1) | 0.0 | 0.0 | 0.0 | 0.0 | 0.0 |
| | (G) | 0 | 0 | 0 | 0 | 0 |

TABLE 2-continued

|  |  | Example | | | | |
|---|---|---|---|---|---|---|
|  |  | 6 | 7 | 8 | 9 | 10 |
| Component (B) (vol %) | | 31 | 32 | 32 | 33 | 32 |
| Component (D) (vol %) | | 63 | 61 | 61 | 59 | 60 |
| Evaluation results | Absolute viscosity (Pa · s) | 549.5 | 280 | 234 | 223.5 | 205 |
| | Thermal conductivity (W/mK) | 1.9 | 1.8 | 1.8 | 1.7 | 1.7 |
| | Minimum thickness (μm) | 5.0 | 4.9 | 4.9 | 4.1 | 4.4 |
| | Thermal resistance (mm$^2$ · K/W) | 2.7 | 2.8 | 2.8 | 2.4 | 2.6 |
| | Thermal resistance after heat cycling (mm$^2$ · K/W) | 2.8 | 3.0 | 2.9 | 2.6 | 2.8 |

TABLE 3

|  |  | Example | | | | |
|---|---|---|---|---|---|---|
|  |  | 11 | 12 | 13 | 14 | 15 |
| Composition (pbw) | (A-1) | 0 | 0 | 0 | 0 | 0 |
| | (A-2) | 0 | 0 | 0 | 0 | 0 |
| | (A-3) | 100 | 0 | 0 | 0 | 0 |
| | (A-4) | 0 | 100 | 100 | 100 | 100 |
| | (B-1) | 500 | 500 | 500 | 500 | 500 |
| | (B-2) | 0 | 0 | 0 | 0 | 0 |
| | (B-3) | 0 | 0 | 0 | 0 | 0 |
| | (B') comparative product | 0 | 0 | 0 | 0 | 0 |
| | (C-1) | 6 | 3 | 4 | 4 | 4 |
| | (C-2) | 0 | 0 | 0 | 0 | 0 |
| | (C-3) | 0 | 0 | 0 | 0 | 0 |
| | (D-1) | 5,200 | 5,000 | 5,250 | 5,500 | 5,750 |
| | (D') comparative product | 0 | 0 | 0 | 0 | 0 |
| | (E-1) | 3 | 3 | 3 | 3 | 3 |
| | (F-1) | 0.0 | 0.0 | 0.0 | 0.0 | 0.0 |
| | (G) | 0 | 0 | 0 | 0 | 0 |
| Component (B) (vol %) | | 33 | 33 | 32 | 31 | 31 |
| Component (D) (vol %) | | 60 | 60 | 61 | 62 | 63 |
| Evaluation results | Absolute viscosity (Pa · s) | 192.5 | 354 | 372 | 382.5 | 402 |
| | Thermal conductivity (W/mK) | 1.7 | 1.7 | 1.8 | 1.9 | 2.0 |
| | Minimum thickness (μm) | 4.7 | 3.9 | 4.9 | 3.8 | 5.1 |
| | Thermal resistance (mm$^2$ · K/W) | 2.8 | 2.3 | 2.7 | 2.0 | 2.6 |
| | Thermal resistance after heat cycling (mm$^2$ · K/W) | 2.9 | 2.4 | 2.8 | 2.2 | 2.7 |

TABLE 4

|  |  | Example | | | | |
|---|---|---|---|---|---|---|
|  |  | 16 | 17 | 18 | 19 | 20 |
| Composition (pbw) | (A-1) | 100 | 100 | 100 | 100 | 100 |
| | (A-2) | 0 | 0 | 0 | 0 | 0 |
| | (A-3) | 0 | 0 | 0 | 0 | 0 |
| | (A-4) | 0 | 0 | 0 | 0 | 0 |
| | (B-1) | 480 | 480 | 480 | 0 | 0 |
| | (B-2) | 0 | 0 | 0 | 480 | 0 |
| | (B-3) | 0 | 0 | 0 | 0 | 480 |
| | (B') comparative product | 0 | 0 | 0 | 0 | 0 |
| | (C-1) | 18 | 0 | 0 | 18 | 18 |
| | (C-2) | 0 | 14 | 0 | 0 | 0 |
| | (C-3) | 0 | 0 | 9 | 0 | 0 |
| | (D-1) | 5,050 | 5,050 | 5,050 | 5,050 | 5,050 |
| | (D') comparative product | 0 | 0 | 0 | 0 | 0 |
| | (E-1) | 1 | 1 | 1 | 1 | 1 |
| | (F-1) | 0.0 | 0.0 | 0.0 | 0.0 | 0.0 |
| | (G) | 0 | 0 | 0 | 0 | 0 |
| Component (B) (vol %) | | 32 | 32 | 32 | 32 | 32 |
| Component (D) (vol %) | | 60 | 60 | 60 | 60 | 60 |
| Evaluation results | Absolute viscosity (Pa · s) | 134 | 140 | 600 | 122 | 146 |
| | Thermal conductivity (W/mK) | 1.7 | 1.7 | 1.8 | 1.7 | 1.7 |
| | Minimum thickness (μm) | 4.8 | 4.9 | 4.9 | 4.7 | 4.9 |
| | Thermal resistance (mm$^2$ · K/W) | 2.8 | 2.9 | 2.7 | 2.8 | 2.9 |
| | Thermal resistance after heat cycling (mm$^2$ · K/W) | 3.0 | 3.1 | 2.8 | 2.9 | 3.1 |

TABLE 5

| | | Comparative Example | | | | |
|---|---|---|---|---|---|---|
| | | 1 | 2 | 3 | 4 | 5 |
| Composition (pbw) | (A-1) | 100 | 100 | 100 | 100 | 100 |
| | (A-2) | 0 | 0 | 0 | 0 | 0 |
| | (A-3) | 0 | 0 | 0 | 0 | 0 |
| | (A-4) | 0 | 0 | 0 | 0 | 0 |
| | (B-1) | 0 | 160 | 160 | 160 | 25 |
| | (B-2) | 0 | 0 | 0 | 0 | 0 |
| | (B-3) | 0 | 0 | 0 | 0 | 0 |
| | (B') comparative product | 160 | 0 | 0 | 0 | 0 |
| | (C-1) | 16 | 16 | 16 | 16 | 0 |
| | (C-2) | 0 | 0 | 0 | 0 | 0 |
| | (C-3) | 0 | 0 | 0 | 0 | 9 |
| | (D-1) | 2,000 | 4,500 | 0 | 0 | 722 |
| | (D') comparative product | 0 | 0 | 2,000 | 1,000 | 0 |
| | (E-1) | 1 | 1 | 1 | 1 | 1 |
| | (F-1) | 2.0 | 2.0 | 2.0 | 2.0 | 0.1 |
| | (G) | 16 | 16 | 16 | 16 | 0 |
| Component (B) (vol %) | | 25 | 15 | 25 | 34 | 9 |
| Component (D) (vol %) | | 55 | 73 | 55 | 38 | 49 |
| Evaluation results | Absolute viscosity (Pa · s) | composition was non-uniform | composition was non-uniform | 430 | 3 | 800 |
| | Thermal conductivity (W/mK) | | | 1.5 | 0.7 | 1.3 |
| | Minimum thickness (μm) | | | 48 | 45 | 13 |
| | Thermal resistance (m² · K/W) | | | 32.0 | 64.3 | 10.0 |
| | Thermal resistance after heat cycling (mm² · K/W) | | | 34.6 | 69.4 | 12.8 |

From the results in Tables 1 to 5, in Examples 1 to 20 which satisfy the conditions of the invention, heat-conductive silicone compositions having a high thermal conductivity and also having at the same time a good compressibility to a thickness of 10 μm or less were obtained. On the other hand, in Comparative Example 1 in which component (B) of the invention was not used, a uniform heat-conductive silicone composition was not obtained. In Comparative Example 2 as well, in which the amount of component (B) was less than 20 vol % and the amount of heat-conductive filler (zinc oxide particles) was more than 70 vol %, a uniform heat-conductive silicone composition was not obtained. In Comparative Example 3 in which zinc oxide particles having a mean particle diameter of 40 μm were used as the heat-conductive filler, the compressibility decreased and the heat resistance value worsened markedly. In Comparative Example 4 in which the content of heat-conductive filler (zinc oxide particles having a mean particle diameter of 40 μm), at less than 40 vol %, was lower than in Comparative Example 3, the thermal conductivity underwent a large decline and the heat resistance value further worsened. In Comparative Example 5, because the component (B) content (both in terms of included weight and vol %) was low, sufficient compressibility was not achieved and so the minimum thickness and thermal conductivity requirements could not both be satisfied at the same time.

The invention is not limited to the embodiments described above, which are presented here for the purpose of illustration. Any embodiments having substantially the same constitution as the technical ideas set forth in the claims and exhibiting similar working effects fall within the technical scope of the invention.

REFERENCE SIGNS LIST

1 Insulated gate bipolar transistor (IGBT)
2 Heat-conductive silicone composition layer
3 Cooling fin
3a Insulating layer
4 Cooling water

The invention claimed is:

1. A heat-conductive silicone composition comprising:
(A) 100 parts by weight of an organopolysiloxane of general formula (1) below

[Chem. 1]

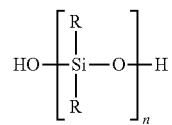

(1)

(wherein each R is a substituted or unsubstituted monovalent hydrocarbon group of 1 to 20 carbon atoms, multiple occurrences of R may be the same or may be different, and n is an integer of 10 or more);
(B) from 150 to 600 parts by weight of an organopolysiloxane of general formula (2) below having at least one hydrolyzable silyl group per molecule

[Chem. 2]

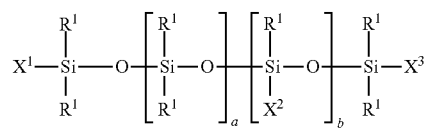

(2)

(wherein each $R^1$ is independently a substituted or unsubstituted monovalent hydrocarbon group, $X^1$ and $X^3$ are each independently a group represented by $R^1$ or $-R^2-SiR^3{}_g(OR^4)_{3-g}$, and $X^2$ is a group represented by $-R^2-SiR^3{}_g(OR^4)_{3-g}$, there being at least one $-R^2-SiR^3{}_g(OR^4)_{3-g}$ moiety on the molecule; $R^2$ is an oxygen atom or an alkylene group of 1 to 4 carbon atoms, each $R^3$ is independently a substituted or unsubstituted monovalent hydrocarbon group which does not contain an aliphatic unsaturated bond, each $R^4$ is independently an alkyl group of 1 to 4 carbon atoms or an alkoxyalkyl, alkenyl or acyl group of 2 to 4 carbon atoms, and g is an integer from 0 to 2; the subscripts a and b respectively satisfy the conditions 1≤a≤1,000 and 0≤b≤1,000, with the proviso that if $X^1$ and $X^3$ are both $R^1$, b satisfies the condition 1≤b≤1,000; and recurring units may each be randomly bonded);

(C) from 0.1 to 100 parts by weight of a crosslinking agent which is a hydrolyzable organosilane compound having one unsubstituted monovalent hydrocarbon group selected from the group consisting of alkyl groups of 1 to 4 carbon atoms, alkenyl groups of 2 to 4 carbon atoms and aryl groups of 6 to 8 carbon atoms and three hydrolyzable groups per molecule and/or a partial hydrolytic condensation product thereof;

(D) from 1,500 to 6,500 parts by weight of zinc oxide particles which have a mean particle diameter of at least 0.1 μm but not more than 2 μm and contain a proportion of coarse product having a particle diameter of 10 μm or more in laser diffraction particle size distribution that is not more than 1 vol % of component (D) overall; and (E) from 0.01 to 30 parts by weight of an adhesion promoter exclusive of component (C), wherein the composition has a content of component (D) that is from 45 to 70 vol % of the overall composition and a thermal conductivity at 25° C. as determined by the hot disk method of at least 1.3 W/mK, and is compressible to a thickness of 10 μm or less.

2. The heat-conductive silicone composition of claim 1, wherein the content of component (B) is from 20 to 40 vol % with respect to the overall composition.

3. The heat-conductive silicone composition of claim 1, further comprising (F) from 0.01 to 20 parts by weight of a reaction catalyst per 100 parts by weight of component (A).

4. The heat-conductive silicone composition of claim 1, further comprising (G) from 1 to 1,000 parts by weight of a filler other than component (D) per 100 parts by weight of component (A).

5. The heat-conductive silicone composition of claim 1 which has a heat resistance at 25° C., as measured by the laser flash method, of 5 mm²·K/W or less.

6. The heat-conductive silicone composition of claim 1 which has an absolute viscosity at 25° C. and a shear rate of 6 s-1, as measured with a spiral viscometer, of from 3 to 600 Pa·s.

7. The heat-conductive silicone composition of claim 1 which can suppress creep following a heat cycling test.

8. The heat-conductive silicone composition of claim 1, wherein component (D) is surface-treated with component (B).

9. A method for producing the heat-conductive silicone composition of claim 1, comprising the step of mixing together components (A), (B), (C), (D) and (E).

10. A method for producing the heat-conductive silicone composition of claim 1, comprising the steps of mixing component (B), or components (A) and (B), together with component (D) for at least 30 minutes at a temperature of 100° C. or more, and then mixing therein at least components (C) and (E).

11. A semiconductor device comprising a heat-generating body and a cooling body between which is formed a gap not thicker than 10 μm, and a layer of the heat-conductive silicone composition of claim 1 that fills the gap, which composition layer is thermally interposed between the heat-generating body and the cooling body.

12. The semiconductor device of claim 11, wherein the heat-generating body is an insulated gate bipolar transistor.

* * * * *